US010446085B2

(12) United States Patent
Xue et al.

(10) Patent No.: US 10,446,085 B2
(45) Date of Patent: Oct. 15, 2019

(54) GOA CIRCUIT FOR SOLVING PROBLEM OF VOLTAGE LEVEL MAINTENANCE AT THE NODE Q

(71) Applicant: Shenzhen China Star Optoelectronics Semiconductor Display Technology Co., Ltd., Shenzhen (CN)

(72) Inventors: Yan Xue, Shenzhen (CN); Baixiang Han, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 127 days.

(21) Appl. No.: 15/579,947

(22) PCT Filed: Nov. 16, 2017

(86) PCT No.: PCT/CN2017/111330
§ 371 (c)(1),
(2) Date: Dec. 6, 2017

(87) PCT Pub. No.: WO2019/037299
PCT Pub. Date: Feb. 28, 2019

(65) Prior Publication Data
US 2019/0066596 A1 Feb. 28, 2019

(30) Foreign Application Priority Data

Aug. 25, 2017 (CN) .......................... 2017 1 0745219

(51) Int. Cl.
*G09G 3/36* (2006.01)
*G09G 3/3266* (2016.01)
(Continued)

(52) U.S. Cl.
CPC ......... *G09G 3/3266* (2013.01); *G11C 19/184* (2013.01); *G11C 19/28* (2013.01);
(Continued)

(58) Field of Classification Search
CPC combination set(s) only.
See application file for complete search history.

(56) References Cited

U.S. PATENT DOCUMENTS 5,859,630 A * 1/1999 Huq ..................... G09G 3/3677
345/100
8,830,156 B2 * 9/2014 Kim ..................... G09G 3/3677
345/100

(Continued)

FOREIGN PATENT DOCUMENTS

CN 105427786 A 3/2016
CN 106652936 A 5/2017
(Continued)

*Primary Examiner* — Pegeman Karimi
(74) *Attorney, Agent, or Firm* — Leong C. Lei

(57) ABSTRACT

The invention provides a GOA circuit, comprising: a plurality of GOA units connected in cascade, for integer n, the n-th GOA unit for outputting an n-th horizontal scan signal comprising: a pull-up unit (10), a pull-up control unit (20), a propagation unit (30), a pull-down unit (40), a pull-down maintenance unit (50), and a bootstrap capacitor (Cbt); the pull-up unit connected to n-th horizontal scan signal output end (G(n)), first node (Q), second node (K), and first clock signal (CLKB); the pull-up control unit connected to first node Q(Q), second node (K), second clock signal (CLK), third node (N), current-stage cascade-propagate signal output end (Cout(n)), and previous-stage cascade-propagate signal output end (Cout(n−1)) or start pulse (STV). The GOA circuit of the invention can maintain node Q voltage level, realize wide bandwidth pulse signal output.

15 Claims, 3 Drawing Sheets

(51) Int. Cl.
  *G11C 19/28*   (2006.01)
  *G11C 19/18*   (2006.01)

(52) U.S. Cl.
  CPC . *G09G 2310/0286* (2013.01); *G09G 2310/06* (2013.01); *G09G 2320/0204* (2013.01)

(56) References Cited

U.S. PATENT DOCUMENTS

| | | | |
|---|---|---|---|
| 9,245,891 B2* | 1/2016 | Umezaki | G11C 19/28 |
| 2007/0296681 A1* | 12/2007 | Kim | G11C 19/184 |
| | | | 345/100 |
| 2008/0048712 A1* | 2/2008 | Ahn | G09G 3/3677 |
| | | | 326/21 |
| 2010/0097368 A1* | 4/2010 | Hwang | G09G 3/3677 |
| | | | 345/213 |
| 2015/0171833 A1 | 6/2015 | Pi et al. | |

FOREIGN PATENT DOCUMENTS

| CN | 106683631 A | 5/2017 |
|---|---|---|
| CN | 106710503 A | 5/2017 |
| CN | 106898290 A | 6/2017 |

\* cited by examiner

GOA CIRCUIT FOR SOLVING PROBLEM OF VOLTAGE LEVEL MAINTENANCE AT THE NODE Q

BACKGROUND OF THE INVENTION

1. Field of the Invention

The present invention relates to the field of display techniques, and in particular to a GOA circuit.

2. The Related Arts

The liquid crystal display (LCD), or LCD panel, provides the advantages of self-luminance, high emission efficiency, high resolution and contrast, near 180° viewing angle, wide operation temperature range, ability to achieve flexible display and large-area full-color display, and is heralded as the display device with most potential. The driving types of OLED can be divided, according to the driving method, into the passive matrix OLED (PMOLED) and active matrix OLED (AMOLED); wherein the AMOLED provides the advantages of pixels arranged in an array, self-luminous, and high luminous efficiency and is commonly used for high definition large-size display.

At present, the horizontal scan lines of the AMOLED display panel are driven by an external integrated circuit (IC). The external IC can control the charging and discharging of the horizontal scan lines in a stage-by-stage manner. On the other hand, the Gate-driver-on-Array (GOA) approach integrates the gate scan driving circuit on the array substrate of the display panel to reduce the number of external IC so as to reduce the manufacturing cost and power consumption of the display panel, as well as achieve narrow border display device. Node Q in the GOA circuit is the gate node to control voltage level of the output signal. When node Q is at high voltage, the TFT is turned on and the output signal stays at high voltage. Therefore, in actual operation, the capability to maintain the voltage level of the node Q is the key to ensure the stable output for GOA circuit. In voltage level maintenance phase of the node Q, the voltage level of the node Q is difficult to maintain for extended duration, leading to GOA circuit failure, which remains a tough issue for GOA circuit design.

SUMMARY OF THE INVENTION

The object of the present invention is to provide a GOA circuit, able to solve the problem of voltage level maintenance at the node Q.

To achieve the above object, the present invention provides a GOA circuit, which comprises: a plurality of cascade GOA units, for an integer n, the n-th GOA unit for outputting an n-th horizontal scan signal comprising: a pull-up unit, a pull-up control unit, a propagation unit, a pull-down unit, a pull-down maintenance unit, and a bootstrap capacitor; the pull-up unit being connected to an n-th horizontal scan signal output end, a first node, a second node, and a first clock signal; the pull-up control unit being connected to the first node, the second node, a second clock signal, a third node, a current-stage cascade-propagate signal output end, and a previous-stage cascade-propagate signal output end or a start pulse; the propagate unit being connected to the first node, the current-stage cascade-propagate signal output end, and the first clock signal; the pull-down unit being connected to the n-th horizontal scan signal output end, the first node, the third node, a next-stage cascade-propagate signal output end, a first direct current (DC) low voltage, and a second DC low voltage; the pull-down maintenance unit being connected to the first node, the second node, the third node, the n-th horizontal scan signal output end, the current-stage cascade-propagate signal output end, a DC high voltage, the first DC low voltage and the second CD low voltage; the bootstrap capacitor having two ends connected respectively to the first node and the n-th horizontal scan signal output end.

According to a preferred embodiment of the present invention, the first clock signal and the second clock signal are alternating signals with opposite phases.

According to a preferred embodiment of the present invention, the pull-up control unit comprises:

a first thin film transistor (TFT), having a gate connected to the second clock signal, a source and a drain connected respectively to the third node and the previous-stage cascade-propagate signal output end or start pulse;

a second TFT, having a gate connected to the second clock signal, a source and a drain connected respectively to the third node and the first node;

a third TFT, having a gate connected to the previous-stage cascade-propagate signal output end, a source and a drain connected respectively to the second node and the third node.

According to a preferred embodiment of the present invention, when n=1, the source and the drain of the first TFT are connected to the third node and the start pulse respectively.

According to a preferred embodiment of the present invention, the pull-up unit comprises:

a fourth TFT, having a gate connected to the first node, a source and a drain connected respectively to the first clock signal and the n-th horizontal scan signal output end;

a fifth TFT, having a gate connected to the first node, a source and a drain connected respectively to the first clock signal and the second node.

According to a preferred embodiment of the present invention, the propagate unit comprises:

a sixth TFT, having a gate connected to the first node, a source and a drain connected respectively to the first clock signal and the current-stage cascade-propagate signal output end.

According to a preferred embodiment of the present invention, the pull-down unit comprises:

a seventh TFT, having a gate connected to the next-stage cascade-propagate signal output end, a source and a drain connected respectively to the n-th horizontal scan signal output end and the second DC low voltage;

an eighth TFT, having a gate connected to the next-stage cascade-propagate signal output end, a source and a drain connected respectively to the third node and the first node;

a ninth TFT, having a gate connected to the next-stage cascade-propagate signal output end, a source and a drain connected respectively to the third node and the first DC low voltage.

According to a preferred embodiment of the present invention, the pull-down maintenance comprises:

a tenth TFT, having a gate connected to a fourth node, a source and a drain connected respectively to the n-th horizontal scan signal and the second DC low voltage;

an eleventh TFT, having a gate connected to the fourth node, a source and a drain connected respectively to the first DC low voltage and the current-stage cascade-propagate signal output end;

a twelfth TFT, having a gate connected to the fourth node, a source and a drain connected respectively to the second node and the second DC low voltage;

a thirteenth TFT, having a gate connected to the fourth node, a source and a drain connected respectively to the third node and the first node;

a fourteenth TFT, having a gate connected to the fourth node, a source and a drain connected respectively to the third node and the first DC low voltage;

a fifteenth TFT, having a gate connected to the DC high voltage, a source and a drain connected respectively to the DC high voltage and a gate of a sixteenth TFT;

the sixteenth TFT, having a source and a drain connected respectively to the fourth node and the DC high voltage;

a seventeenth TFT, having a gate connected to the first node, a source and a drain connected respectively to the gate of the sixteenth TFT and the first DC low voltage;

an eighteenth TFT, having a gate connected to the first node, a source and a drain connected respectively to the fourth node and the first DC low voltage.

According to a preferred embodiment of the present invention, the second DC low voltage is higher than the first DC low voltage.

According to a preferred embodiment of the present invention, the GOA circuit is prepared based on Indium Gallium Zinc Oxide (IGZO) material.

The present invention also provides a GOA circuit, which comprises: a plurality of cascade GOA units, for an integer n, the n-th GOA unit for outputting an n-th horizontal scan signal comprising: a pull-up unit, a pull-up control unit, a propagation unit, a pull-down unit, a pull-down maintenance unit, and a bootstrap capacitor; the pull-up unit being connected to an n-th horizontal scan signal output end, a first node, a second node, and a first clock signal; the pull-up control unit being connected to the first node, the second node, a second clock signal, a third node, a current-stage cascade-propagate signal output end, and a previous-stage cascade-propagate signal output end or a start pulse; the propagate unit being connected to the first node, the current-stage cascade-propagate signal output end, and the first clock signal; the pull-down unit being connected to the n-th horizontal scan signal output end, the first node, the third node, a next-stage cascade-propagate signal output end, a first direct current (DC) low voltage, and a second DC low voltage; the pull-down maintenance unit being connected to the first node, the second node, the third node, the n-th horizontal scan signal output end, the current-stage cascade-propagate signal output end, a DC high voltage, the first DC low voltage and the second CD low voltage; the bootstrap capacitor having two ends connected respectively to the first node and the n-th horizontal scan signal output end;

wherein the first clock signal and the second clock signal being alternating signals with opposite phases;

wherein the pull-up control unit comprising:

a first thin film transistor (TFT), having a gate connected to the second clock signal, a source and a drain connected respectively to the third node and the previous-stage cascade-propagate signal output end or start pulse;

a second TFT, having a gate connected to the second clock signal, a source and a drain connected respectively to the third node and the first node;

a third TFT, having a gate connected to the previous-stage cascade-propagate signal output end, a source and a drain connected respectively to the second node and the third node;

wherein when n=1, the source and the drain of the first TFT being connected to the third node and the start pulse respectively;

wherein the pull-up unit comprising:

a fourth TFT, having a gate connected to the first node, a source and a drain connected respectively to the first clock signal and the n-th horizontal scan signal output end;

a fifth TFT, having a gate connected to the first node, a source and a drain connected respectively to the first clock signal and the second node;

wherein the propagate unit comprising:

a sixth TFT, having a gate connected to the first node, a source and a drain connected respectively to the first clock signal and the current-stage cascade-propagate signal output end.

In summary, the GOA circuit of the present invention can effectively solve the Q node voltage level maintenance problem and achieve wide pulse GOA signal output.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
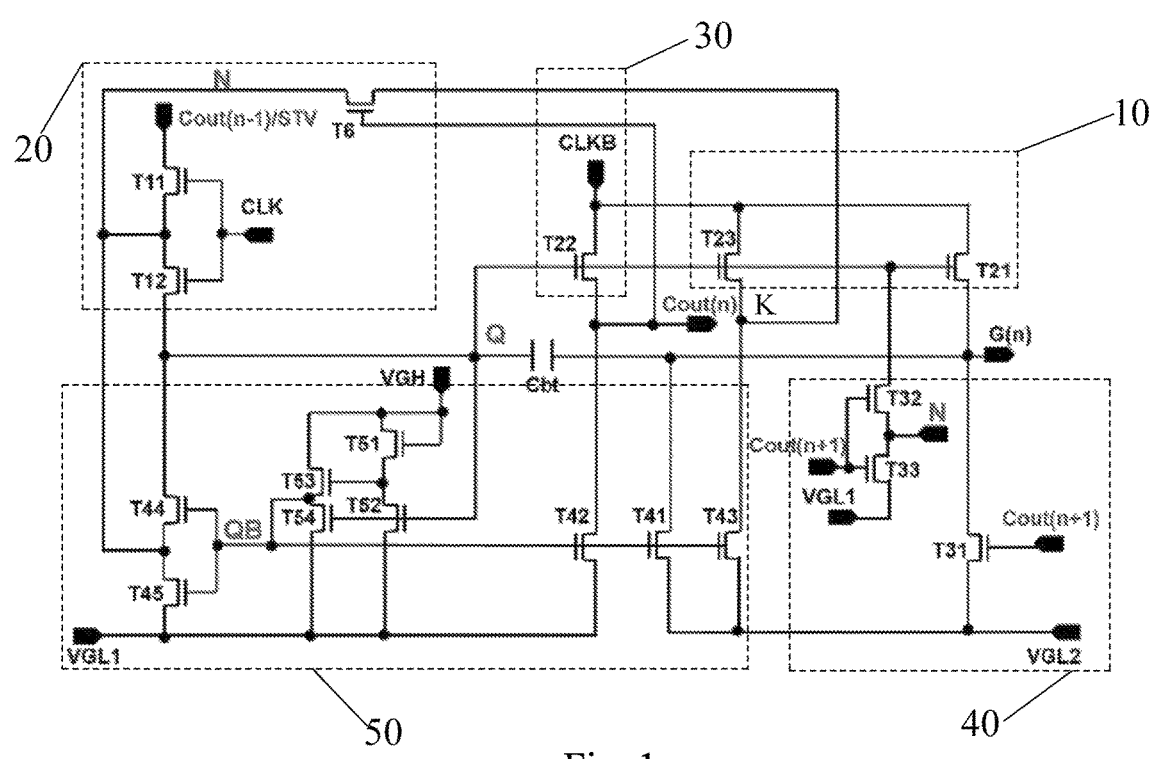
FIG. 1 is a schematic view showing a circuit of a preferred embodiment of the GOA circuit of the present invention.
Figure 2:
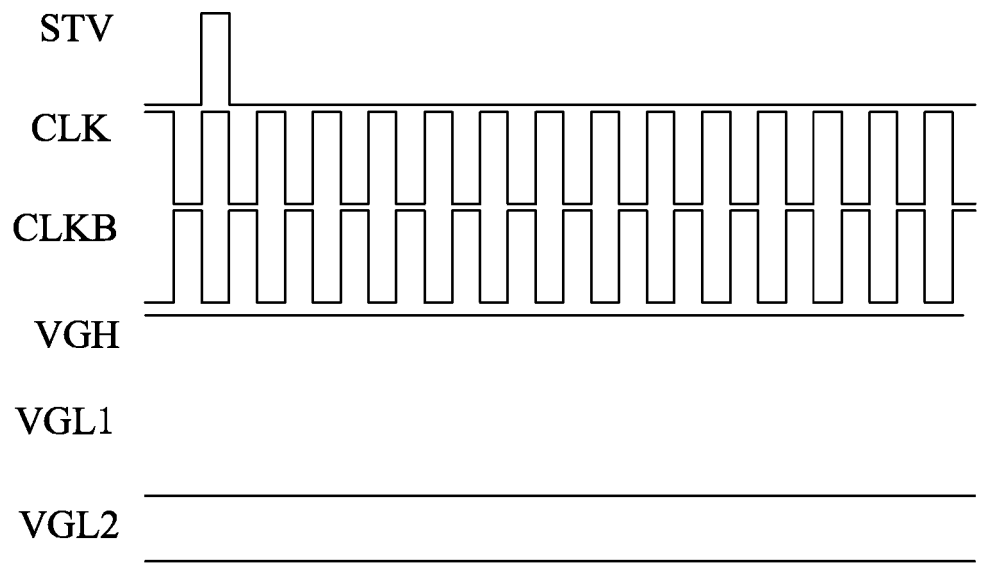
FIG. 2 is a schematic view showing signal waveforms of input source of a preferred embodiment of the GOA circuit of the present invention.

Referring to FIG. 1 and FIG. 2, the preferred embodiment of the present invention comprises 18 TFTs and a capacitor Cbt. The interconnection of the element is as shown in FIG. 1. CLK and CLKB are alternating current power source with opposite phases, VGH, VGL1 and VGL2 are DC power source, and STV is the start pulse trigger signal, which is for activating the first GOA unit in the cascade. The relation between specific waveform and voltage of each signal in the GOA circuit is shown in Table 1. The nodes N, Q, QB, Count(n−1), Count(n), Count(n+1), and G(n) are important nodes in the circuit.

| GOA signal | voltage | |
| --- | --- | --- |
| | Min (volts) | Max (volts) |
| STV | −10 | +30 |
| CLK | −10 | +30 |
| CLKB | −10 | +30 |
| VGH | | +30 |
| VGL1 | | −10 |
| VGL2 | | −6 |

The other panel parameters applied to the preferred embodiment can be set as follows: for FHD, the number of scan lines is 1080, the number of clock signals (CK number) is 2, i.e., CLK and CLKB, the clock period is 336 ms, duty cycle is 50%, and STV width is 168 ms.

The n-th GOA unit of the present invention comprises: a pull-up unit 10, a pull-up control unit 20, a propagation unit 30, a pull-down unit 40, a pull-down maintenance unit 50, and a bootstrap capacitor Cbt.

The pull-up unit 10 is connected to an n-th horizontal scan signal output end G(n), a first node Q, a second node K, and a first clock signal CLKB; the pull-up unit 10 is mainly responsible for transforming the clock signal into the output signal G(n), and comprises TFT T21 and T23; T21 has a gate connected to the first node Q, a source and a drain connected respectively to the first clock signal CLKB and the n-th horizontal scan signal output end G(n); T23 has a gate connected to the first node Q, a source and a drain connected respectively to the first clock signal CLKB and the second node K.

The pull-up control unit 20 is connected to the first node Q, the second node K, a second clock signal CLK, a third node N, a current-stage cascade-propagate signal output end Cout(n), and a previous-stage cascade-propagate signal output end Cout(n−1) or a start pulse STV; the function of the pull-up control unit 20 is to pull up the node Q voltage level and control the turn on of the pull-up unit 10. The pull-up control unit 20 comprises: T11, having a gate connected to the second clock signal CLK, a source and a drain connected respectively to the third node N and the previous-stage cascade-propagate signal output end Cout(n−1) or start pulse STV; T12, having a gate connected to the second clock signal CLK, a source and a drain connected respectively to the third node N and the first node Q; T6, having a gate connected to the previous-stage cascade-propagate signal output end Cout(n−1), a source and a drain connected respectively to the second node K and the third node N. The T11 of the first GOA unit is connected to the STV signal.

The propagate unit 30 is connected to the first node Q, the current-stage cascade-propagate signal output end Cout(n), and the first clock signal CLKB, and is mainly for using the Cout(n) signal as the input signal for the next-stage GOA unit and feedback signal for the previous-stage GOA unit. The propagate unit 30 mainly comprises: T22, having a gate connected to the first node Q, a source and a drain connected respectively to the first clock signal CLKB and the current-stage cascade-propagate signal output end Cout(n).

The pull-down unit 40 is connected to the n-th horizontal scan signal output end G(n), the first node Q, the third node N, a next-stage cascade-propagate signal output end Cout(n), a first direct current (DC) low voltage VGL1, and a second DC low voltage VGL2, and is responsible for pulling down the node Q voltage level and the output signal to low voltage. The pull-down unit 40 comprises: T31, having a gate connected to the next-stage cascade-propagate signal output end Cout(n+1), a source and a drain connected respectively to the n-th horizontal scan signal output end G(n) and the second DC low voltage VGL2; T32, having a gate connected to the next-stage cascade-propagate signal output end Cout(n+1), a source and a drain connected respectively to the third node N and the first node Q; T33, having a gate connected to the next-stage cascade-propagate signal output end Cout(n+1), a source and a drain connected respectively to the third node N and the first DC low voltage VGL1.

The pull-down maintenance unit 50 is connected to the first node Q, the second node K, the third node N, the n-th horizontal scan signal output end G(n), the current-stage cascade-propagate signal output end Cout(n), a DC high voltage VGH, the first DC low voltage VGL1 and the second CD low voltage VGL2, and is responsible for maintaining the node Q voltage level and G(n) in cut-off state. The pull-down maintenance unit 50 comprises: T41, having a gate connected to a fourth node QB, a source and a drain connected respectively to the n-th horizontal scan signal G(n) and the second DC low voltage VGL2; T42, having a gate connected to the fourth node QB, a source and a drain connected respectively to the first DC low voltage VGL1 and the current-stage cascade-propagate signal output end Cout(n); T43, having a gate connected to the fourth node QB, a source and a drain connected respectively to the second node K and the second DC low voltage VGL2; T44, having a gate connected to the fourth node QB, a source and a drain connected respectively to the third node N and the first node Q; T45, having a gate connected to the fourth node QB, a source and a drain connected respectively to the third node N the first DC low voltage VGL1; T51, having a gate connected to the DC high voltage VGH, a source and a drain connected respectively to the DC high voltage VGH and a gate of T53; T53, having a source and a drain connected respectively to the fourth node QB and the DC high voltage VGH; T52, having a gate connected to the first node Q, a source and a drain connected respectively to the gate of T53 and the first DC low voltage VGL1; T54, having a gate connected to the first node Q, a source and a drain connected respectively to the fourth node QB and the first DC low voltage VGL1.

The bootstrap capacitor Cbt has two ends connected respectively to the first node Q and the n-th horizontal scan signal output end G(n).

Figure 3:
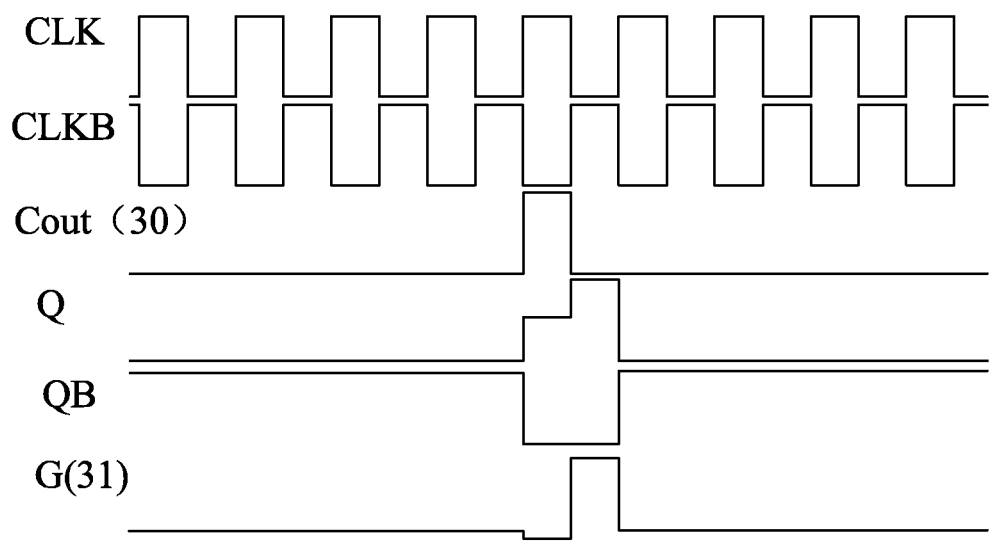
FIG. 3 is a schematic view showing the output waveform of the 31$^{st}$ GOA unit of a preferred embodiment of the GOA circuit of the present invention.

Refer to FIG. 3, which shows a schematic view showing the output waveform of the $31^{st}$ GOA unit of a preferred embodiment of the GOA circuit of the present invention. By inputting the waveform shown in FIG. 2 into the GOA circuit of the present invention, the output signal is excellent. The following uses the $31^{st}$ stage GOA unit (G31) as an example to describe the operation of the circuit.

When Cout(30) is at high voltage and CLK is also at high voltage, T11 and T22 are turned on. The high voltage at Cout(30) reaches the node Q and Q becomes at high voltage, and T21, T22 and T23 are turned on. Because an inverter is between Q and QB, Q and QB have opposite phases. Hence, QB is at low voltage, and T41, T42, T43, T44, and T45 are all cut-off. Cout(32) is at low voltage and T31, T32, and T33 are cut-off. CLKB is at low voltage and the outputs Cout(n) and G(n) are both at low voltage.

Then, Cout(30) and CLK are at low voltage, T11 and T22 are cut-off. AT this point, the node Q is under the effect of capacitor coupling and raised to an even higher voltage level. T31, T32, T33, T41, T42, T43, T44, and T45 are still cut-off. CLKB is at high voltage, and Cout(31) and G(31) are at high voltage. At this point, T6 is turned on, and the node N is at high voltage and the voltage level lowers the leakage current of T12, T44, and T32. It should be noted that the present invention introduces two VGL lines, wherein VGL2>VGL1 so that Vgs<0 to reduce the risk of current leakage when the threshold voltages Vth of TFT T31, T41, T43, and T6 have negative value. Moreover, in the 168 ms voltage level maintenance duration, the node Q voltage level is not reduced, which shows that the circuit can effectively solve the Q node voltage level maintenance problem.

Then, CLK is raised to high voltage, Cout(30) becomes at low voltage and Cout(32) is at high voltage. T11, T12, T31, T32, and T33 are turned on. The node Q voltage level is pulled down. AT hits point, the node QB voltage level is pulled up to high voltage, and T41, T42, T43, T44, and T45 are all turned on. Cout (31) and G(31) are pulled down to low voltages VGL1 and VGL2 respectively.

Figure 4:
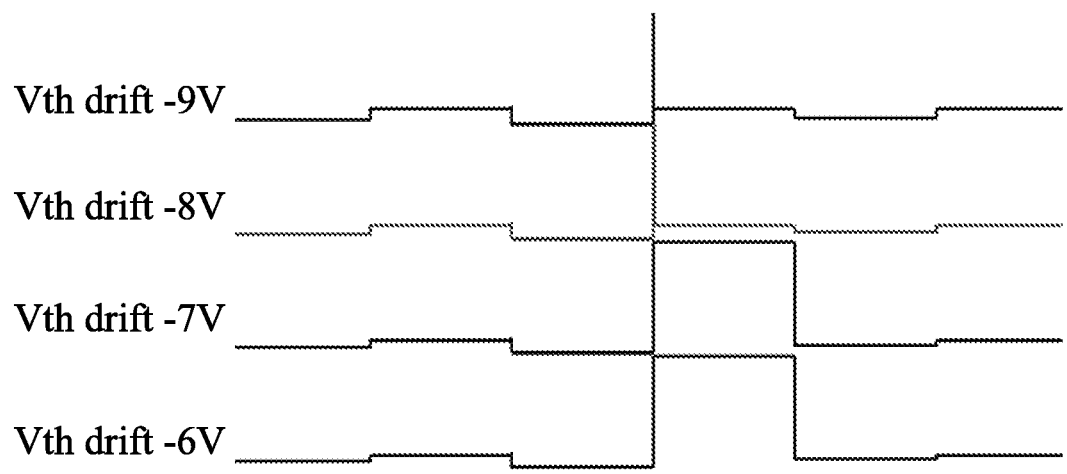
FIG. 4 is a schematic view showing the effect of preventing threshold voltage Vth offset for a preferred embodiment of the GOA circuit of the present invention.

Refer to FIG. 4. FIG. 4 is a schematic view showing the effect of preventing threshold voltage Vth offset for a preferred embodiment of the GOA circuit of the present invention. By introducing two VGL lines, with VGL2>VGL1, the present invention reduces the risk of current leakage when the threshold voltages Vth of TFT T31, T41, T43, and T6 have negative value. Therefore, the present invention can also prevent the Vth becomes negative. As shown in FIG. 4, when Vth drift towards the negative for 7V, the circuit can still operate normally, and G(n) waveform maintains normal output.

The capability to maintain the node Q voltage level is the key factor of restricting the outputting wide bandwidth pulses by IGZO GOA circuit. The present invention provides an IGZO-GOA circuit, which is able to maintain node Q voltage level, realize wide bandwidth pulse signal output, and is applicable to LCD display as well as OLED display.

In summary, the GOA circuit of the invention can maintain node Q voltage level, realize wide bandwidth pulse signal output.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A gate-driver-on-array (GOA) circuit, which comprises: a plurality of cascade GOA units, for an integer n, the n-th GOA unit for outputting an n-th horizontal scan signal comprising: a pull-up unit, a pull-up control unit, a propagation unit, a pull-down unit, a pull-down maintenance unit, and a bootstrap capacitor; the pull-up unit being connected to an n-th horizontal scan signal output end, a first node, a second node, and a first clock signal; the pull-up control unit being connected to the first node, the second node, a second clock signal, a third node, a current-stage cascade-propagate signal output end, and a previous-stage cascade-propagate signal output end or a start pulse; the propagate unit being connected to the first node, the current-stage cascade-propagate signal output end, and the first clock signal; the pull-down unit being connected to the n-th horizontal scan signal output end, the first node, the third node, a next-stage cascade-propagate signal output end, a first direct current (DC) low voltage, and a second DC low voltage; the pull-down maintenance unit being connected to the first node, the second node, the third node, the n-th horizontal scan signal output end, the current-stage cascade-propagate signal output end, a DC high voltage, the first DC low voltage and the second CD low voltage; the bootstrap capacitor having two ends connected respectively to the first node and the n-th horizontal scan signal output end.

2. The GOA circuit as claimed in claim 1, wherein the first clock signal and the second clock signal are alternating signals with opposite phases.

3. The GOA circuit as claimed in claim 1, wherein the pull-up control unit comprises:
a first thin film transistor (TFT), having a gate connected to the second clock signal, a source and a drain connected respectively to the third node and the previous-stage cascade-propagate signal output end or start pulse;
a second TFT, having a gate connected to the second clock signal, a source and a drain connected respectively to the third node and the first node;
a third TFT, having a gate connected to the previous-stage cascade-propagate signal output end, a source and a drain connected respectively to the second node and the third node.

4. The GOA circuit as claimed in claim 3, wherein when n=1, the source and the drain of the first TFT are connected to the third node and the start pulse respectively.

5. The GOA circuit as claimed in claim 1, wherein the pull-up unit comprises:
a fourth TFT, having a gate connected to the first node, a source and a drain connected respectively to the first clock signal and the n-th horizontal scan signal output end;
a fifth TFT, having a gate connected to the first node, a source and a drain connected respectively to the first clock signal and the second node.

6. The GOA circuit as claimed in claim 1, wherein the propagation unit comprises:
a sixth TFT, having a gate connected to the first node, a source and a drain connected respectively to the first clock signal and the current-stage cascade-propagate signal output end.

7. The GOA circuit as claimed in claim 1, wherein the pull-down unit comprises:
a seventh TFT, having a gate connected to the next-stage cascade-propagate signal output end, a source and a drain connected respectively to the n-th horizontal scan signal output end and the second DC low voltage;
an eighth TFT, having a gate connected to the next-stage cascade-propagate signal output end, a source and a drain connected respectively to the third node and the first node;
a ninth TFT, having a gate connected to the next-stage cascade-propagate signal output end, a source and a drain connected respectively to the third node and the first DC low voltage.

8. The GOA circuit as claimed in claim 1, wherein the pull-down maintenance unit comprises:
a tenth TFT, having a gate connected to a fourth node, a source and a drain connected respectively to the n-th horizontal scan signal and the second DC low voltage;
an eleventh TFT, having a gate connected to the fourth node, a source and a drain connected respectively to the first DC low voltage and the current-stage cascade-propagate signal output end;
a twelfth TFT, having a gate connected to the fourth node, a source and a drain connected respectively to the second node and the second DC low voltage;
a thirteenth TFT, having a gate connected to the fourth node, a source and a drain connected respectively to the third node and the first node;
a fourteenth TFT, having a gate connected to the fourth node, a source and a drain connected respectively to the third node and the first DC low voltage;

a fifteenth TFT, having a gate connected to the DC high voltage, a source and a drain connected respectively to the DC high voltage and a gate of a sixteenth TFT;

the sixteenth TFT, having a source and a drain connected respectively to the fourth node and the DC high voltage;

a seventeenth TFT, having a gate connected to the first node, a source and a drain connected respectively to the gate of the sixteenth TFT and the first DC low voltage;

an eighteenth TFT, having a gate connected to the first node, a source and a drain connected respectively to the fourth node and the first DC low voltage.

9. The GOA circuit as claimed in claim 1, wherein the second DC low voltage is higher than the first DC low voltage.

10. The GOA circuit as claimed in claim 1, wherein the GOA circuit is prepared based on Indium Gallium Zinc Oxide (IGZO) material.

11. A gate-driver-on-array (GOA) circuit, which comprises: a plurality of cascade GOA units, for an integer n, the n-th GOA unit for outputting an n-th horizontal scan signal comprising: a pull-up unit, a pull-up control unit, a propagation unit, a pull-down unit, a pull-down maintenance unit, and a bootstrap capacitor; the pull-up unit being connected to an n-th horizontal scan signal output end, a first node, a second node, and a first clock signal; the pull-up control unit being connected to the first node, the second node, a second clock signal, a third node, a current-stage cascade-propagate signal output end, and a previous-stage cascade-propagate signal output end or a start pulse; the propagate unit being connected to the first node, the current-stage cascade-propagate signal output end, and the first clock signal; the pull-down unit being connected to the n-th horizontal scan signal output end, the first node, the third node, a next-stage cascade-propagate signal output end, a first direct current (DC) low voltage, and a second DC low voltage; the pull-down maintenance unit being connected to the first node, the second node, the third node, the n-th horizontal scan signal output end, the current-stage cascade-propagate signal output end, a DC high voltage, the first DC low voltage and the second CD low voltage; the bootstrap capacitor having two ends connected respectively to the first node and the n-th horizontal scan signal output end;

wherein the first clock signal and the second clock signal being alternating signals with opposite phases;

the pull-up control unit comprising:

a first thin film transistor (TFT), having a gate connected to the second clock signal, a source and a drain connected respectively to the third node and the previous-stage cascade-propagate signal output end or start pulse;

a second TFT, having a gate connected to the second clock signal, a source and a drain connected respectively to the third node and the first node;

a third TFT, having a gate connected to the previous-stage cascade-propagate signal output end, a source and a drain connected respectively to the second node and the third node;

wherein when n=1, the source and the drain of the first TFT being connected to the third node and the start pulse respectively;

wherein the pull-up unit comprising:

a fourth TFT, having a gate connected to the first node, a source and a drain connected respectively to the first clock signal and the n-th horizontal scan signal output end;

a fifth TFT, having a gate connected to the first node, a source and a drain connected respectively to the first clock signal and the second node;

wherein the propagation unit comprising:

a sixth TFT, having a gate connected to the first node, a source and a drain connected respectively to the first clock signal and the current-stage cascade-propagate signal output end.

12. The GOA circuit as claimed in claim 11, wherein the pull-down unit comprises:

a seventh TFT, having a gate connected to the next-stage cascade-propagate signal output end, a source and a drain connected respectively to the n-th horizontal scan signal output end and the second DC low voltage;

an eighth TFT, having a gate connected to the next-stage cascade-propagate signal output end, a source and a drain connected respectively to the third node and the first node;

a ninth TFT, having a gate connected to the next-stage cascade-propagate signal output end, a source and a drain connected respectively to the third node and the first DC low voltage.

13. The GOA circuit as claimed in claim 11, wherein the pull-down maintenance unit comprises:

a tenth TFT, having a gate connected to a fourth node, a source and a drain connected respectively to the n-th horizontal scan signal and the second DC low voltage;

an eleventh TFT, having a gate connected to the fourth node, a source and a drain connected respectively to the first DC low voltage and the current-stage cascade-propagate signal output end;

a twelfth TFT, having a gate connected to the fourth node, a source and a drain connected respectively to the second node and the second DC low voltage;

a thirteenth TFT, having a gate connected to the fourth node, a source and a drain connected respectively to the third node and the first node;

a fourteenth TFT, having a gate connected to the fourth node, a source and a drain connected respectively to the third node and the first DC low voltage;

a fifteenth TFT, having a gate connected to the DC high voltage, a source and a drain connected respectively to the DC high voltage and a gate of a sixteenth TFT;

the sixteenth TFT, having a source and a drain connected respectively to the fourth node and the DC high voltage;

a seventeenth TFT, having a gate connected to the first node, a source and a drain connected respectively to the gate of the sixteenth TFT and the first DC low voltage;

an eighteenth TFT, having a gate connected to the first node, a source and a drain connected respectively to the fourth node and the first DC low voltage.

14. The GOA circuit as claimed in claim 11, wherein the second DC low voltage is higher than the first DC low voltage.

15. The GOA circuit as claimed in claim 11, wherein the GOA circuit is prepared based on Indium Gallium Zinc Oxide (IGZO) material.

* * * * *